United States Patent
Sasaki et al.

(10) Patent No.: US 6,742,573 B2
(45) Date of Patent: Jun. 1, 2004

(54) HEAT SINK INCLUDING A HEAT DISSIPATING FIN AND METHOD FOR FIXING THE HEAT DISSIPATING FIN

(75) Inventors: Chiyoshi Sasaki, Tokyo (JP); Junji Sotani, Tokyo (JP); Masaru Ohmi, Tokyo (JP); Toshikatsu Hama, Tokyo (JP); Yasuhiro Ootori, Tokyo (JP)

(73) Assignees: The Furukawa Electric Co., Ltd., Tokyo (JP); Sony Computer Entertainment, Inc., Tokyo (JP)

( * ) Notice: Subject to any disclaimer, the term of this patent is extended or adjusted under 35 U.S.C. 154(b) by 245 days.

(21) Appl. No.: 10/005,191

(22) Filed: Dec. 4, 2001

(65) Prior Publication Data

US 2002/0084060 A1 Jul. 4, 2002

Related U.S. Application Data

(63) Continuation-in-part of application No. 09/642,742, filed on Aug. 18, 2000, now Pat. No. 6,357,514.

(30) Foreign Application Priority Data

Aug. 18, 1999 (JP) .............................. 11-231437

(51) Int. Cl.⁷ .................................. F28F 7/00
(52) U.S. Cl. ....................... 165/80.3; 165/185; 361/697; 361/704; 174/16.3; 257/706
(58) Field of Search ............... 165/185, 80.3, 165/104.33; 361/703, 704, 697, 710; 174/16.3; 257/706, 722

(56) References Cited

U.S. PATENT DOCUMENTS

| | | | |
|---|---|---|---|
| 3,236,296 A | 2/1966 | Dubin | |
| 4,009,752 A | 3/1977 | Wilson | |
| 5,964,285 A | 10/1999 | Huang | |
| 6,296,048 B1 * | 10/2001 | Sauer | 165/80.3 |
| 6,401,807 B1 * | 6/2002 | Wyler et al. | 165/121 |
| 2002/0005272 A1 * | 1/2002 | Hirano et al. | 165/80.3 |

FOREIGN PATENT DOCUMENTS

| | | |
|---|---|---|
| EP | 0637079 | 2/1995 |
| JP | 57042154 | 3/1982 |
| TW | 407757 | 10/2000 |

* cited by examiner

Primary Examiner—Terrell McKinnon
(74) Attorney, Agent, or Firm—Oblon, Spivak, McClelland, Maier & Neustadt, P.C.

(57) ABSTRACT

A heat sink including a heat dissipating fin comprises (1) a heat dissipating fin having a plurality of mountain-shaped portions and base portions supporting the mountain-shaped portions, (2) a base member having a plurality of slits into which the mountain-shaped portions of the heat dissipating fin are to be inserted and a plurality of holes for fixing the heat dissipating fin, and (3) a fitting member, provided with a plurality of projecting portions corresponding to the plurality of holes of the base member, for fixing the heat dissipating fin between the base member and the fitting member itself.

5 Claims, 8 Drawing Sheets

HEAT SINK INCLUDING A HEAT DISSIPATING FIN AND METHOD FOR FIXING THE HEAT DISSIPATING FIN

RELATED APPLICATIONS

This application is a continuation-in-pan of, and incorporates by reference in its entirety, co-pending U.S. patent application entitled "HEAT SINK INCLUDING A HEAT DISSIPATING FIN AMD METHOD FOR FIXING THE HEAT DISSIPATING FIN", having application No. 09/642,742, filed on Aug. 18, 2000 (which issued as U.S. Pat. No. 6,357,514 on Mar. 19, 2002.

BACKGROUND OF THE INVENTION

1. Field of the Invention

The present invention relates to a heat sink including a heat dissipating fin and a method for fixing the heat dissipating fin to the heat sink main body. A heat sink including a heat dissipating fin according to the present invention may be utilized not only for heat dissipating and cooling of a heat generating electronic component or the like used in an electronic device but also for heat dissipating and cooling of articles in any field which require heat dissipation.

2. Related Art

A semiconductor chip or the like used in various electronic devices such as a personal computer, a game console, an audio system or the like has been made smaller in size, and larger in integration density to remarkably improve processing speed, and therewith heat generating density thereof becomes much larger.

Various corrugated fins such as those comprising sequentially connected elongate U shaped parts (hereinafter referred to as "elongated folded fin") are widely used as a means for dissipating the heat generated by a semiconductor chip or the like having large heat generating density which is mounted in such electronic devices as a personal computer, a game console, an audio system or the like. Although the elongated folded fin is light in weight and has a limited enveloped volume, the heat dissipating area thereof can be made wider.

The heat generated by a heat source is transferred to a heat transfer plate, block or the like, and then the heat thus transferred is dissipated through the elongated folded fin attached to the heat transfer plate, block or the like. The elongated folded fin is joined to the heat transfer plate, block or the like by brazing or soldering. Alternatively, the elongated folded fin is fixed to the heat transfer plate, block or the like by caulking or screwing. Furthermore, the elongated folded fin is adhered by an adhesive agent, a double-sided adhesive tape or the like.

However, the above-mentioned conventional method for attaching the elongated folded fin to the heat transfer plate, block or the like has the following problems. Namely, the method of joining the elongated folded fin to the heat transfer plate, block or the like by brazing or soldering, as well as the method of adhering the heat transfer plate, block or the like by the adhesive agent have a problem of its high processing cost. Additionally, the method of joining the elongated folded fin to the heat transfer plate, block or the like by brazing or soldering has a problem that the fin is softened and the strength thereof is lowered by the heat in the joining process.

The method of fixing the elongated folded fin to the heat transfer plate, block or the like by caulking or screwing, as well as the method of adhering the elongated folded fin to the heat transfer plate, block or the like by the double-sided adhesive tape have a problem in which the heat transfer resistance (i.e, contact heat resistance) between the elongated folded fin and the heat transfer plate, block or the like becomes large.

Furthermore, the method of adhering the elongated folded fin to the heat transfer plate, block or the like by an adhesive agent has a problem in which the products thus processed do not have uniform heat transfer resistance, thus having a different quality in heat transfer resistance.

An object of the present invention is therefore to provide a heat sink including a heat dissipating fin which is inexpensive in processing cost, uniform in heat transfer resistance and excellent in heat transfer efficiency without degrading the strength of the fin, and a method for fixing the heat dissipating fin to the heat sink main body.

SUMMARY OF THE INVENTION

The inventors have been studying hard to solve the above-mentioned problems in the conventional art. As a result, the following findings are obtained.

More specifically, it has been found that it is possible to provide a heat sink including a heat dissipating fin, being inexpensive in processing cost, uniform in heat transfer resistance and excellent in heat transfer efficiency without degrading the strength of the fin, by firstly preparing a heat dissipating fin in a shape of a folded fin comprising mountain-shaped portions, a base member and a fitting member, then forming in the base member square slits having the size and number corresponding to the width, depth, mountain pitch, number of mountains of the heat dissipating fin, and holes for fixing the heat dissipating fin, then making on the fitting member projecting portions corresponding to the holes, then inserting the heat dissipating fins into the slits, fitting the projecting portions into the holes, pressing the heat dissipating fin between the base member and the fitting member, and caulking the heads of the fitted projecting portions, thereby fixing the heat dissipating fin.

Furthermore, it has been found that the same effect as described above can be also obtained by providing in a fitting member holes for fixing a heat dissipating fin and providing in a base member projecting portions corresponding to the holes.

In addition, it has been found that it is possible to more effectively fix a heat dissipating fin between a base member and a fitting member by providing a curved portion in a part of the base member and pressing the heat dissipating fin by the curved portion.

The present invention has been made on the basis of the information obtained as described above.

The first embodiment of a heat sink of the present invention is a heat sink including a heat dissipating fin, comprising:

(1) a heat dissipating fin having a plurality of mountain-shaped portions and base portions supporting said mountain-shaped portions;

(2) a base member having a plurality of slits into which said mountain-shaped portions of said heat dissipating fin are to be inserted and a plurality of holes for fixing said heat dissipating fin; and (3) a fitting member, provided with a plurality of projecting portions corresponding to said plurality of holes of said base member, for fixing said heat dissipating fin between said base member and the fitting member itself.

The second embodiment of a heat sink of the present invention is a heat sink including a heat dissipating fin, comprising:
(1) a heat dissipating fin having a plurality of mountain-shaped portions and base portions supporting said mountain-shaped portions;
(2) a base member having a plurality of slits into which said mountain-shaped portions of said heat dissipating fin are to be inserted and a plurality of projecting portions for fixing said heat dissipating fin; and
(3) a fitting member, provided with a plurality of holes corresponding to said plurality of projecting portions of said base member, for fixing said heat dissipating fin between said base member and the fitting member itself.

The third embodiment of a heat sink of the present invention is a heat sink including a heat dissipating fin, wherein:
said mountain-shaped portions of said heat dissipating fin are inserted into said slits of said base member, said base portions of said heat dissipating fin are put between said base member and said fitting member, said projecting portions are fitted into said holes, and said projecting portions are caulked, thereby said heat dissipating fin is fixed between said base member and said fitting member.

The fourth embodiment of a heat sink of the present invention is a heat sink including a heat dissipating fin, wherein:
at least a part of regions positioned between said plurality of slits of said base member, said regions being to come into contact with said base portions of said heat dissipating fin, forms a curved portion by being drawn down toward said fitting member in such manner that said heat dissipating fin is fixed between said base member and said fitting member by means of an elastic action of said curved portion.

The fifth embodiment of a heat sink of the present invention is a heat sink including a heat dissipating fin, wherein:
when said heat dissipating fin is fixed between said base member and said fitting member in such manner that regions of said base member which come into contact with said base portions of said heat dissipating fin are drawn up by a distance corresponding to a thickness of said base member toward said heat dissipating fin, a lower face of the base portions of said heat dissipating fin and a lower face of said base member are positioned nearly in a same plane.

The sixth embodiment of a heat sink of the present invention is a heat sink including a heat dissipating fin, wherein:
a heat pipe is thermally connected to said fitting member in such manner that heat transferred by said heat pipe is dissipated through said fitting member and said heat dissipating fin.

The first embodiment of a method of the invention is a method for fixing a heat dissipating fin, comprising the steps of:
(1) preparing a heat dissipating fin comprising a plurality of mountain-shaped portions and base portions supporting said mountain-shaped portions;
(2) preparing a base member having a plurality of slits into which said plurality of mountain-shaped portions are to be inserted and a plurality of holes;
(3) preparing a fitting member provided with a plurality of projecting portions corresponding to said plurality of holes of said base member;
(4) inserting said mountain-shaped portions of said heat dissipating fin into said slits of said base member, putting said base portion of said heat dissipating fin between said base member and said fitting member, and fitting said projecting portions into said holes; and
(5) caulking said projecting portions which are fitted into said holes, thereby fixing said heat dissipating fin between said base member and said fitting member.

The second embodiment of a method of the invention is a method for fixing a heat dissipating fin, comprising the steps of:
(1) preparing a heat dissipating fin comprising a plurality of mountain-shaped portions and base portions supporting said mountain-shaped portions;
(2) preparing a base member having a plurality of slits into which said plurality of mountain-shaped portions are to be inserted and a plurality of projecting portions;
(3) preparing a fitting member provided with a plurality of holes corresponding to said plurality of projecting portions of said base member;
(4) inserting said mountain-shaped portions of said heat dissipating fin into said slits of said base member, putting said base portion of said heat dissipating fin between said base member and said fitting member and fitting said projecting portions into said holes; and
(5) caulking said projecting portions which are fitted into said holes, thereby fixing said heat dissipating fin between said base member and said fitting member.

The third embodiment of a method of the invention is a method for fixing a beat dissipating fin, further comprising the steps of:
in preparation of said base member, forming a curved portion by drawing down at least a part of regions positioned between said plurality of slits of said base member, said regions being to come into contact with said base portions of said heat dissipating fin, toward said fitting member in such manner that said heat dissipating fin is fixed between said base member and said fitting member by means of an elastic action of said curved portion.

The fourth embodiment of a method of the invention is a method for fixing a heat dissipating fin, further comprising the steps of:
in preparation of said base member, when fixing said heat dissipating fin between said base member and said fitting member in such manner that regions of said base member which come into contact with said base portions of said heat dissipating fin are drawn up by a distance corresponding to a thickness of said base member toward said heat dissipating fin, a lower face of the base portion of said heat dissipating fin and a lower face of said base member are prepared so as to be positioned nearly in the same plane.

The fifth embodiment of a method of the invention is a method for fixing a heat dissipating fin, further comprising the step of providing a heat pipe so as to be thermally connected to said fitting member.

DETAILED DESCRIPTION OF THE PREFERRED EMBODIMENTS

A heat sink including a heat dissipating fin of the present invention is described with reference to the drawings.

A heat sink including a heat dissipating fin of the invention comprises:

(1) a heat dissipating fin having a plurality of mountain-shaped portions and base portions supporting said mountain-shaped portions;

(2) a base member having a plurality of slits into which said mountain-shaped portions of said heat dissipating fin are to be inserted and a plurality of holes for fixing said heat dissipating fin; and (3) a fitting member, provided with a plurality of projecting portions corresponding to said plurality of holes of said base member, for fixing said heat dissipating fin between said base member and the fitting member itself.

More specifically, in the above-mentioned embodiment, the base member is provided with slits and holes, and the fitting member is provided with projecting portions corresponding to the holes.

Figure 4:
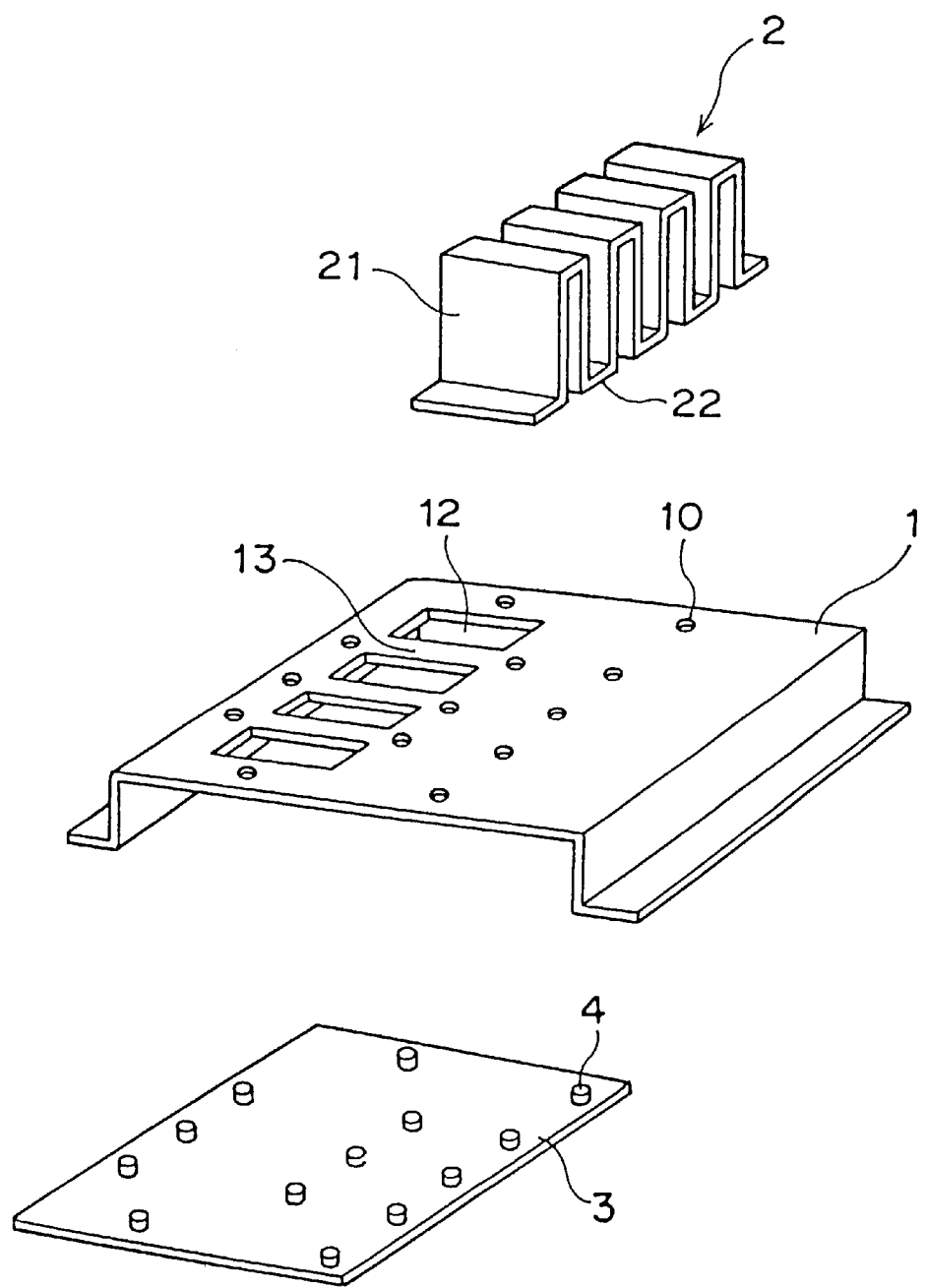
FIG. 4 shows essential elements of a heat sink including a heat dissipating fin of the present invention.

FIG. 4 shows essential elements of a heat sink including a heat dissipating fin of the present invention. As shown in FIG. 4, a heat dissipating fin 2 comprises a plurality of mountain-shaped portions 21 and base portions 22 supporting the mountain-shaped portions. A base member 1 has a plurality of slits 12 and a plurality of holes 10 formed therein. A fitting member 3 has projecting portions 4 thereon corresponding to the holes 10.

Figure 1:
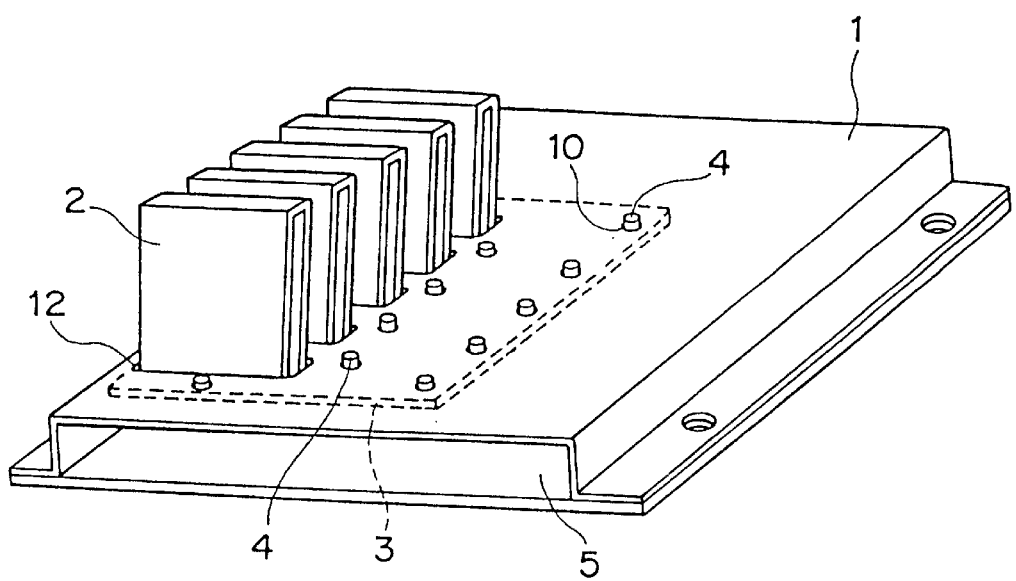
FIG. 1 is a schematic perspective view showing a heat sink including a heat dissipating fin of the present invention.

FIG. 1 is a schematic perspective view showing a heat sink including a heat dissipating fin of the present invention. In FIG. 1, the mountain-shaped portions 21 of the heat dissipating fin 2 described in FIG. 4 are inserted into the slits 12 to project upward above the base member 1, and the projecting portions 4 are fitted into the holes 10 and their heads are caulked. As shown in FIG. 1, the heat dissipating fin 2 is sandwiched and fixed between the base member and the fitting member. In this situation, since the lower face of the regions 13 positioned between the slits and the upper face of the base portions 22 of the heat dissipating fin are fast pressed and fixed to each other, the contact heat resistance therebetween can be made small.

In addition, since the lower face of the base portions 22 of the heat dissipating fin and the upper face of the fitting member 3 are fast pressed and fixed to each other in the same way, the contact heat resistance therebetween can be made small. Therefore, heat is efficiently transferred from the fitting member directly to the heat dissipating fin, and furthermore, heat is efficiently transferred from the fitting member partially through the base member to the heat dissipating fin.

Furthermore, in a heat sink including a heat dissipating fin of the present invention, as described above, the mountain-shaped portions 21 of the heat dissipating fin 2 are inserted into the slits 12 of the base member 1. The base portions 22 of the heat dissipating fin 2 is put between the base member 1 and the fitting member 3. The projecting portions 4 are fitted into the holes 10, and the heads of the projecting portions 4 are caulked. Thus, the heat dissipating fin 2 is fixed between the base member 1 and the fitting member 3.

Furthermore, A heat sink including a heat dissipating fin comprises: (1) a heat dissipating fin having a plurality of mountain-shaped portions and base portions supporting said mountain-shaped portions; (2) a base member having a plurality of slits into which said mountain-shaped portions of said heat dissipating fin are to be inserted and a plurality of projecting portions for fixing said heat dissipating fin; and (3) a fitting member, provided with a plurality of holes corresponding to said plurality of projecting portions of said base member, for fixing said heat dissipating fin between said base member and the fitting member itself.

More specifically, in the above-mentioned embodiment, the base member is provided with slits and projecting portions and the fitting member is provided with holes corresponding to the projecting portions.

Figure 2:
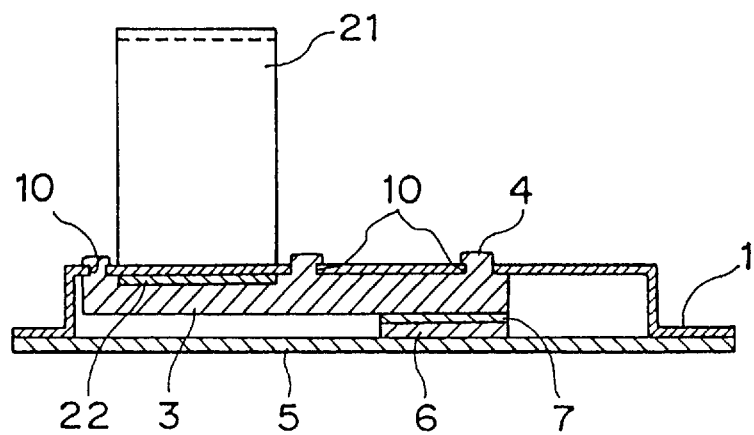
FIG. 2 is a partial cross-sectional view showing a heat sink including a heat dissipating fin of the present invention.

FIG. 2 is a partial cross-sectional view showing a heat sink including a heat dissipating fin of the present invention. As shown in FIG. 2, the base portions 22 of the heat dissipating fin 2 is put and fixed between the base member 1 and the fitting member 3. In this situation, when a specific recessed portion is formed in advance in the fitting member 3 so as to receive the base portion 22 of the heat dissipating fin 2 therein, the heat dissipating fin 2 can be fit without vacant space between the base member 1 and the fitting member 3.

Furthermore, as shown in FIG. 2, the projecting portions 4 provided on the fitting member 3 are inserted into the holes 10 provided in the base member 1 and the heads of the projecting portions 4 are caulked. A heat sink of the present invention in which a heat dissipating fin is put and fixed between the base member and the fitting member is fixed on a circuit board 5 by fitting the peripheral portion of the base member 1 on the circuit board 5.

A heat generating element 6 is disposed at a specific location on the circuit board, and the heat generating element 6 is connected to the fitting member 3 through a heat-conductive rubber sheet 7 in a state where there is no heat transfer resistance. Therefore, the heat generated by the heat generating element 6 is transferred to the heat-conductive rubber sheet 7, the fitting member 3 and the heat dissipating fin 2, and is dissipated into the atmosphere.

Figure 3:
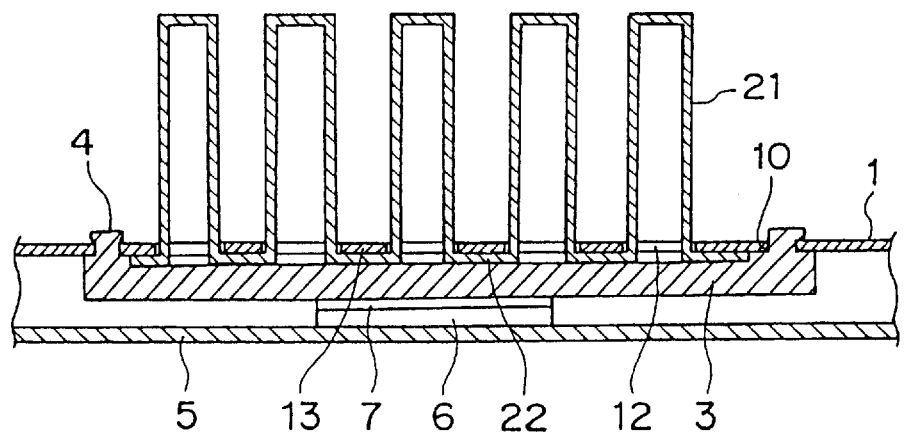
FIG. 3 is a partial longitudinal-sectional view showing a heat sink including a heat dissipating fin of the present invention.

FIG. 3 is a partial longitudinal-sectional view showing a heat sink including a heat dissipating fin of the present invention.

As shown in FIG. 3, the mountain-shaped portions 21 of the heat dissipating fin 2 are inserted into the slits 12 of the base member 1, and the base portions 22 of the heat dissipating fin 2 is placed between the fitting member 3 and the regions 13 which are positioned between the slits of the base member 1. The projecting portions 4 are inserted into the holes 10 of the base member 1 and the heads of the projecting portions are caulked, thus the heat dissipating fin 2 is fixed.

A heat generating element 6 is disposed at a specific location on the circuit board, and the heat generating element 6 is connected to the fitting member 3 through a heat-conductive rubber sheet 7 in a state where there is no heat transfer resistance. Therefore, as described in FIG. 2, the heat generated by the heat generating element 6 is transferred to the heat-conductive rubber sheet 7, the fitting member 3, the base portions 22 and the mountain-shaped portions 21 of the heat dissipating fin 2, and is dissipated into the atmosphere.

Moreover, in a heat sink including a heat dissipating fin of the present invention, at least a part of regions positioned between a plurality of slits of a base member, which regions are to come into contact with the base portions of the heat dissipating fin, forms a curved portion by being drawn down toward the fitting member in such manner that the heat dissipating fin is fixed between the base member and the fitting member by means of an elastic action of the curved portion.

Figure 7:
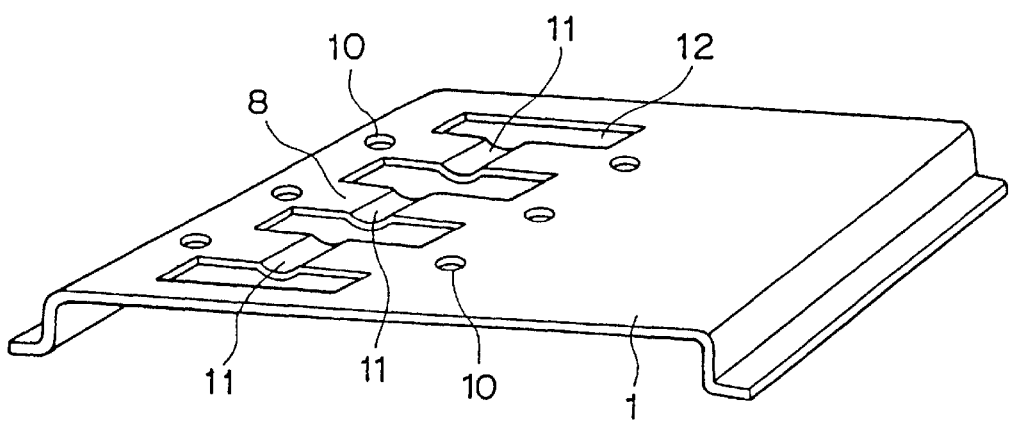
FIG. 7 is a perspective view showing an embodiment of a base member in a heat sink including a heat dissipating fin of the present invention.
Figure 8:
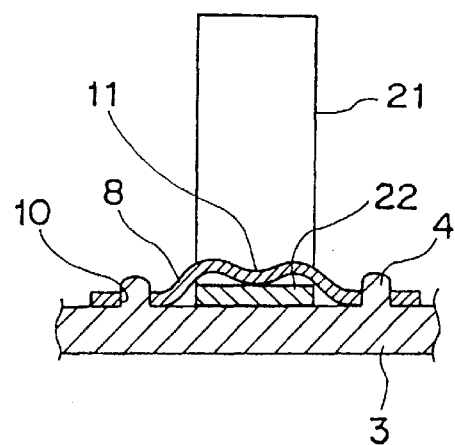
FIG. 8 is a partial cross-sectional view showing an embodiment of a heat sink including a heat dissipating fin of the present invention.

The above-mentioned embodiment of a heat sink including a heat dissipating fin of the present invention is described more in detail with reference to FIGS. 7 and 8.

FIG. 7 is a perspective view showing am embodiment of a base member in a heat sink including a heat dissipating fin of the present invention. As shown in FIG. 7, a base member 1 is provided with a plurality of slits 12 and holes 10, and curved portions 11 formed by being drawn down toward a fitting member 3 are provided in regions 8 positioned between the slits 12. The width and depth of the slits and the numbers thereof are formed so as to correspond to the width, depth, mountain pitch and number of the mountain-shaped portions of the heat dissipating fin used.

The shape of the curved portion 11 formed by being drawn down is determined in consideration of the material, thickness and the like of the base member. When the heat dissipating fin 2 is placed between the base member 1 and the fitting member 3, since the curved portions 11 formed by being drawn down as described above presses elastically the base portions of the heat dissipating fin, the heat dissipating fin is more effectively and securely fixed. The curved portion may be formed in the form of a triangle and the number of the curved portions is not limited to one.

FIG. 8 is a partial cross-sectional view showing an embodiment of a heat sink including a heat dissipating fin of the present invention. FIG. 8 shows a state where the curved portion 11 formed by being drawn down as described above presses elastically the base portion 22 of the heat dissipating fin 2. More specifically, mountain-shaped portions 21 of the heat dissipating fin 2 are inserted into the slits of the base member and the base portions 22 of the heat dissipating fin 2 are elastically pressed by the curved portions 11 formed in the regions 8 positioned between the slits of the base member. The projecting portions 4 of the fitting member 3 are inserted into the holes 10 provided in the base member and the heads of the projecting portions are caulked. As a result, the heat dissipating fin is effectively fixed between the base member and the fitting member.

Furthermore, in a heat sink including a heat dissipating fin of the present invention, regions of a base member which come into contact with the base portions of the heat dissipating fin are drawn up by a distance corresponding to the thickness of the base member toward the heat dissipating fin, and then the heat dissipating fin is fixed between the base member and the fitting member in such manner that the lower face of the base portions of the heat dissipating fin and the lower face of the base member are positioned nearly in the same plane.

Figure 5:
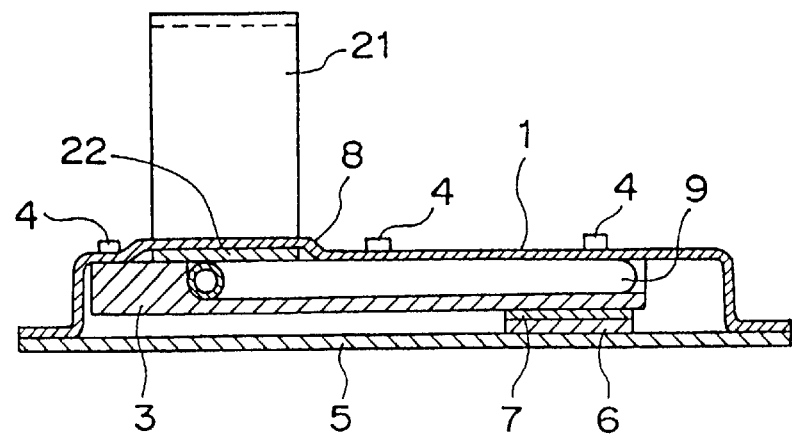
FIG. 5 is a partial cross-sectional view showing a heat sink including a heat dissipating fin of the present invention provided with a heat pipe.
Figure 6:
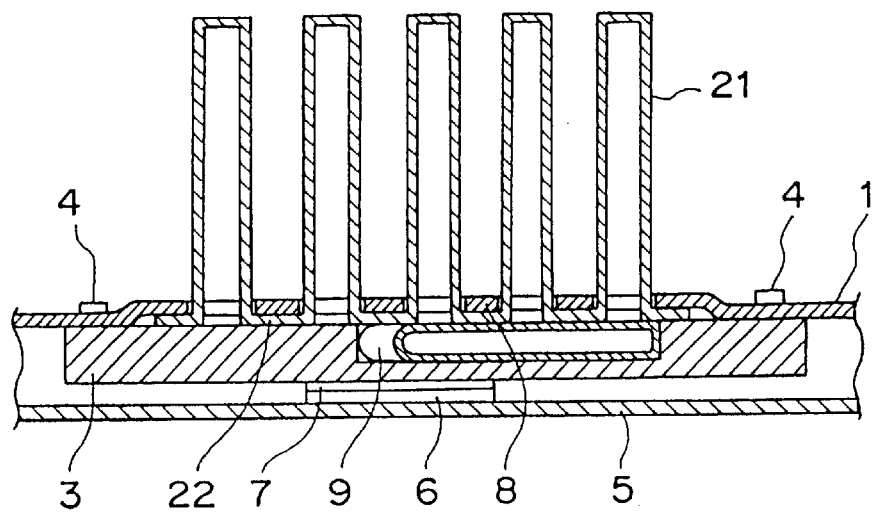
FIG. 6 is a partial longitudinal-sectional view showing a heat sink including a heat dissipating fin of the present invention provided with a heat pipe.

The above-mentioned embodiment of a heat sink including a heat dissipating fin of the present invention is described more in detail with reference to FIGS. 5 and 6.

FIG. 5 is a partial cross-sectional view showing a heat sink including a heat dissipating fin of the present invention provided with a heat pipe. As shown in FIG. 5, portions including the regions positioned between slits of the base member 1 are drawn up by a distance corresponding to the thickness of the base member 1 toward the mountain-shaped portions 21 of the heat dissipating fin 2. When the base portions 22 of the heat dissipating fin 2 are placed and fixed between the base member 1 and the fitting member 3, the lower face of the base portions 22 of the heat dissipating fin 2 and the lower face of the base member 1 are positioned nearly in the same plane.

FIG. 6 is a partial longitudinal-sectional view showing a heat sink including a heat dissipating fin provided with a heat pipe of the present invention. As shown in FIG. 6, portions including the regions 8 positioned between slits of the base member 1 are drawn up by a distance corresponding to the thickness of the base member 1 toward the mountain-shaped portions 21 of the heat dissipating fin 2. When the base portions 22 of the heat dissipating fin 2 are placed and fixed between the base member 1 and the fitting member 3, the lower face of the base portions 22 of the heat dissipating fin 2 and the lower face of the base member 1 are positioned nearly in the same plane. According to this embodiment, the heat dissipating fin is effectively fixed between the base member 1 and the fitting member 3.

Furthermore, in a heat sink including a heat dissipating fin of the present invention, a heat pipe is thermally connected to a fitting member. An outline thereof is shown in FIGS. 5 and 6. In FIG. 5, a heat pipe is attached through a heat-conductive rubber sheet 7 to a heat generating element 6 positioned on a circuit board 5. The heat pipe 9 is extended toward the heat dissipating fin, is bent nearly at a right angle and is arranged along the heat dissipating fin. Heat generated by the heat generating element 6 is transferred by the heat pipe 9 to the lower part of the heat dissipating fin and then is dissipated by the heat dissipating fin into the atmosphere. The shape of the heat pipe is determined in such manner that the heat can be most efficiently transferred depending upon the positions of the heat generating element and the heat dissipating fin. FIG. 6 shows a longitudinal sectional view of the heat sink including the heat pipe. As shown in FIG. 6, the heat pipe reaching to the lower part of the heat dissipating fin is bent and arranged in the longitudinal direction of the heat dissipating fin.

Next, a method for fixing a heat dissipating fin of the present invention to the heat sink body is described.

A method for fixing a heat dissipating fin of the present invention comprises the steps of:

(1) preparing a heat dissipating fin comprising a plurality of mountain-shaped portions and base portions supporting said mountain-shaped portions;

(2) preparing a base member having a plurality of slits into which said plurality of mountain-shaped portions are to be inserted and a plurality of holes;

(3) preparing a fitting member provided with a plurality of projecting portions corresponding to said plurality of holes of said base member;

(4) inserting said mountain-shaped portions of said heat dissipating fin into said slits of said base member, putting said base portion of said heat dissipating fin between said base member and said fitting member, and fitting said projecting portions into said holes; and (5) caulking said projecting portions which are fitted into said holes, thereby fixing said heat dissipating fin between said base member and said fitting member.

More specifically, in the above-mentioned method, the base member is provided with slits and holes, and the fitting member is provided with projecting portions corresponding to the holes.

Furthermore, a method for fixing a heat dissipating fin of the present invention comprises the steps of:

(1) preparing a heat dissipating fin comprising a plurality of mountain-shaped portions and base portions supporting said mountain-shaped portions;

(2) preparing a base member having a plurality of slits into which said plurality of mountain-shaped portions are to be inserted and a plurality of projecting portions;

(3) preparing a fitting member provided with a plurality of holes corresponding to said plurality of projecting portions of said base member;

(4) inserting said mountain-shaped portions of said heat dissipating fin into said slits of said base member, putting said base portion of said heat dissipating fin between said base member and said fitting member and fitting said projecting portions into said holes; and (5) caulking said projecting portions which are fitted into said holes, thereby fixing said heat dissipating fin between said base member and said fitting member.

More specifically, in the above-mentioned method, the base member is provided with slits and projecting portions, and the fitting member is provided with holes corresponding to the projecting portions.

Furthermore, the method for fixing a heat dissipating fin of the present invention further comprises the steps of: in preparation of the base member, a curved portion is formed by drawing down at least a part of regions positioned between the plurality of slits of the base member, which regions are to come into contact with the base portions of the heat dissipating fin, toward the fitting member in such manner that the heat dissipating fin is fixed between the base member and the fitting member by means of an elastic action of the curved portion.

In addition, the method for fixing a heat dissipating fin of the present invention further comprises the steps of: in preparation of the base member, when fixing the heat dissipating fin between the base member and the fitting member in such manner that regions of the base member which come into contact with the base portions of the heat dissipating fin are drawn up by a distance corresponding to a thickness of the base member toward the heat dissipating fin, a lower face of the base portion of the heat dissipating fin and a lower face of the base member are prepared so as to be positioned nearly in the same plane.

Furthermore, the method for fixing a heat dissipating fin of the present invention further comprises the step of: providing a heat pipe so as to be thermally connected to the fitting member.

As described above, the positioning of the heat dissipating fin can be implemented by forming slits in the base member which are formed in accordance with the shape of mountain-shaped portions (the width, depth, mountain pitch and number of mountains) of the heat dissipating fin. Furthermore, the regions positioned between the slits which are residual area of the base member function as pressing plates. In addition, the three components which are the heat dissipating fin, the base member and the fitting member are thermally connected to one another by pressing sandwich the heat dissipating fin between the fitting member and the base member.

Furthermore, since the heads of the projecting portions are caulked in a state of being pressed down, the three components are kept in a state of being thermally connected even if the pressing force is released.

Figure 9:
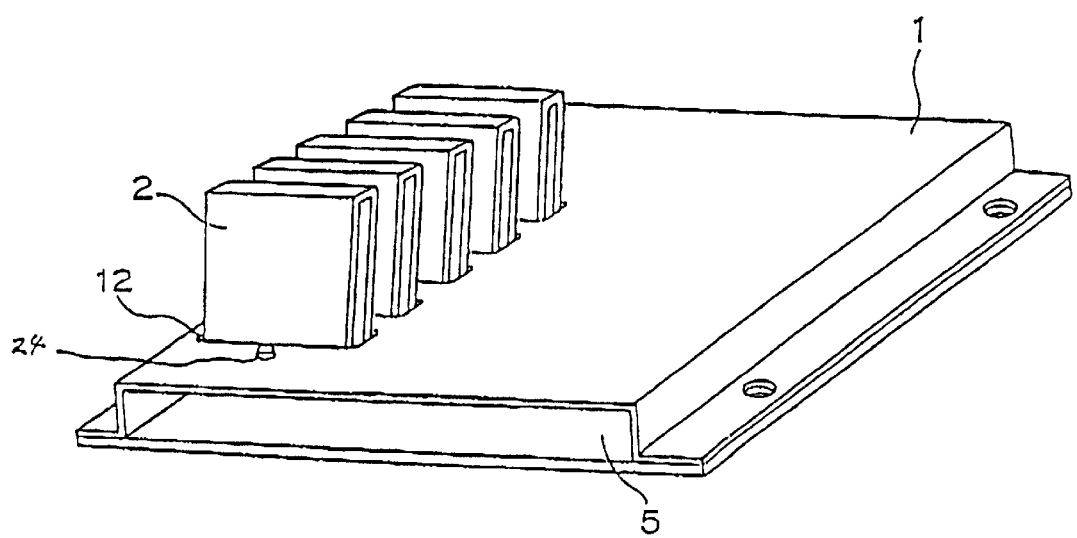
FIG. 9 is a schematic perspective view showing other embodiment of a heat sink including a heat dissipating fin of the present invention.

FIG. 9 is a schematic perspective view showing other embodiment of a heat sink including a heat dissipating fin of the present invention. Other embodiment of a beat sink including a heat dissipating fin thermally connected to a heat generating element through a heat conductive rubber sheet, comprises:

(1) a heat dissipating fin having a plurality of mountain-shaped portions and base portions supporting said mountain-shaped portions; and (2) a base member having a plurality of slits into which said mountain-shaped portions of said heat dissipating fin are to be inserted.

Figure 10:
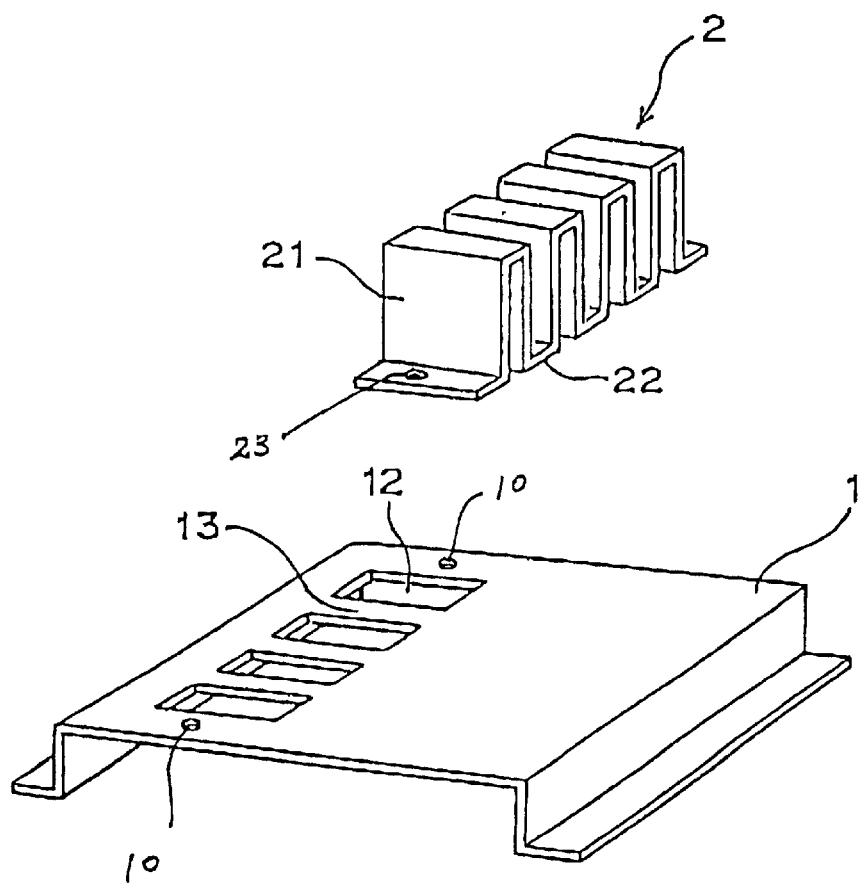
FIG. 10 shows essential elements of other embodiment of a heat sink including a heat dissipating fin of the present invention.

FIG. 10 shows essential elements of other embodiment of a heat sink including a heat dissipating fin of the present invention. As shown in FIG. 10, a heat dissipating fin 2 comprises a plurality of mountain-shaped portions 21 and base portions 22 supporting the mountain-shaped portions. A hole portions 23 are provided on the base portion 22 located on the respective ends portion thereof. A base member 1 has a plurality of slits 12 and corresponding holes 10 formed therein to the hole portions 23.

Figure 11:
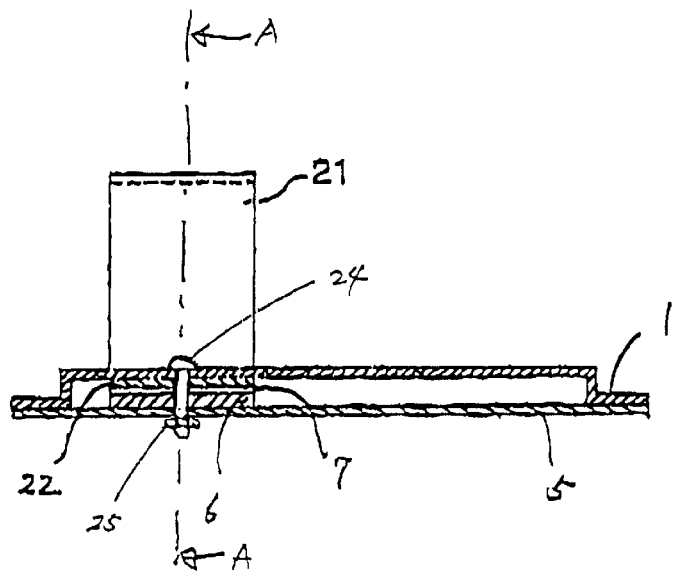
FIG. 11 is a partial cross-sectional view showing other embodiment of a heat sink including a heat dissipating fin of the present invention.

More specifically, in the above-mentioned embodiment, the fitting member is not included. Accordingly, in the above-mentioned embodiment, the mountain-shaped portions 21 of the heat dissipating fin are inserted into the slits 12 of the base member 1, and the base portions 22 of the heat dissipating fin 2 are put between the base member 1 and a heat generating element 6 through a heat conductive rubber sheet 7, as shown in FIG. 11. In addition, a bolt 24 may be inserted into the hole portion 23 and the hole 10, and a nut 25 is screwed on the end of the bolt, thus, the base portion 22 of the heat dissipating fin 2 is pressed to the heat generating element 6 through the heat conductive rubber sheet by means of the bolt and nut which fixes the base member 1 and the circuit board 5.

Figure 12:
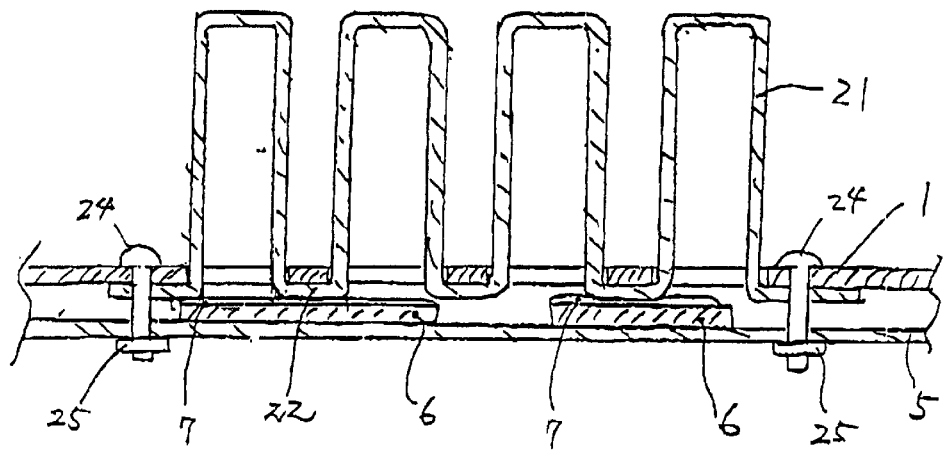
FIG. 12 is a partial cross-sectional view along A—A line in FIG. 11 showing the embodiment of a heat sink including a heat dissipating fin of the invention.

FIG. 12 is a partial cross-sectional view along A—A line in FIG. 11 showing the embodiment of a heat sink including a heat dissipating fin of the invention. As shown in FIG. 12, a plurality of heat generating elements 6 are thermally connected to the base portions 22 of the heat dissipating fin 22 through the heat conductive rubber sheet 7. Preferably, the width of the heat dissipating fin 22 is the same as the size (i.e., width) of the heat generating element 6, as shown in FIG. 11. With the use of the bolt and nut, the heat generating element and the base portion of the heat dissipating fin can be firmly fixed in a sandwiched manner, thus reducing heat resistant therebetween.

Furthermore, in other embodiment of a heat sink including a heat dissipating fin, at least a part of regions positioned between the plurality of slits of the base member, the regions of which come into contact with the base portions of the heat dissipating fin, forms a curved portion by being drawn down toward the heat generating element in such manner that the heat dissipating fin is fixed between the base member and the heat generating element through the heat conductive rubber sheet by means of an elastic action of the curved portion.

As shown in FIG. 7, a base member 1 is provided with a plurality of slits 12 and holes 10, and curved portions 11 formed by being drawn down toward a heat generating element (not shown) are provided in regions 8 positioned between the slits 12. The width and depth of the slits and the numbers thereof are formed so as to correspond to the width, depth, mountain pitch and number of the mountain-shaped portions of the heat dissipating fin used.

The shape of the curved portion 11 formed by being drawn down is determined in consideration of the material, thickness and the like of the base member. When the heat dissipating fin 2 is placed between the base member 1 and the heat generating element through a heat conductive rubber sheet (not shown), since the curved portions 11 formed by being drawn down as described above presses elastically the base portions of the heat dissipating fin, the heat dissipating fin is more effectively and securely fixed. The curved portion may be formed in the form of a triangle and the number of the curved portions is not limited to one.

Furthermore, in other embodiment of a heat sink including a heat dissipating fin, a heat pipe may be further connected to the base portions of the heat dissipating fin.

A heat sink including a heat dissipating fin of the present invention is described more in detail by means of examples.

EXAMPLE

Example 1

According to the present invention, a heat generating element (of 25 mm in length, 25 mm in width, 2 mm in height, and 15 W in heat generating rate) mounted on a circuit board (of 150 mm in length, 70 mm in width and 1.2 mm in thickness) of an electronic device was cooled by a heat sink including a heat dissipating fin comprising the following.

More specifically, as the base member in the heat sink, a shielding plate for electromagnetic shield (of 150 mm in length, 70 mm in width, 0.5 mm in thickness) which is made of aluminum A1050 was used.

As the heat dissipating fin, a folded (corrugated) fin made of aluminum A1050 in which the height of the mountain-shaped portions is 35 mm, the pitch of mountains is 4 mm, the depth is 20 mm, the number of mountains is 8, and the thickness of the fin plate is 0.4 mm was used.

As the fitting member, a heat receiving and heat transfer block made by an aluminum die casting process (of 90 mm in length, 45 mm in width and 4 mm in thickness) was used, and 15 pins each being 2 mm in outer diameter and 1.2 mm in height were provided thereon as the projecting portions.

In the base member, 8 slits of 2.6 mm×20.2 mm in size for the heat dissipating fin were formed, and in addition, 15 holes of 2.2 mm in diameter into which the projecting portions are to be inserted were formed.

The regions positioned between slits of the base member were uniformly drawn up by 0.4 mm toward the mountain-shaped portions in such manner that the bottom face of the heat dissipating fin and the bottom face of (the main body of) the base member form the same plane, when the mountain-shaped portions are inserted into the slits of the base member and the heat dissipating fin is placed between, the base member and the fitting member.

A heat sink was prepared by inserting the mountain-shaped portions into the slits from the lower side of the base member, pressing sandwich the heat dissipating fin between the base member and the fitting member by means of a press, and caulking the heads of the pins which are the projecting portions.

Furthermore, a heat transfer rubber sheet (of 25 mm in length, 25 mm in width, 1 mm in thickness, and 2.5 W/mk in heat transfer rate) was adhered onto the heat generating element.

The circuit board and the heat sink were screwed on each other, and the fitting member of the heat sink was attached at a position where the heat transfer rubber sheet became 0.8 mm in thickness.

In an apparatus including the heat sink thus formed, a ventilating fan is installed and a wind of 1.5 m/s in wind velocity flows through the heat dissipating fin.

The apparatus was operated for four hours, and the surface temperature of the heat generating element was measured. As a result, a temperature rise from the atmospheric temperature was 65° C. and the heat resistance including the heat transfer rubber sheet was 4.3° C./W, thus showing excellent performance.

Example 2

A heat sink including a heat dissipating fin was prepared by embedding a heat pipe of 3 mm in diameter and 90 mm in length in the fitting member used in the Example 1.

More specifically, an L-shaped groove of 2.9 mm in width, 2.9 in depth and 90 mm in length was formed in the middle portion of the fitting member, which was positioned 45 mm laterally from one end of the fitting member. The L-shaped groove was formed therein along the longitudinal direction of the heat dissipating fin.

The other components and a method for fabricating them were the same as those shown in Example 1.

A wind inside the apparatus was also the same as described in Example 1.

The heat sink including the above-mentioned heat pipe were operated to dissipate and cool the heat generated by the heat generating element, and the surface temperature of the heat generating element was measured. As a result, a temperature rise from the atmospheric temperature was 43° C. and the heat resistance including the heat transfer rubber sheet was 2.8° C./W, thus showing remarkably excellent performance.

Example 3

According to the present invention, a heat generating element (of 25 mm in length, 25 mm in width, 2 mm in height, and 15 W in heat generating rate) mounted on a circuit board (of 150 mm in length, 70 mm in width and 1.2 mm in thickness) of an electronic device was cooled by a heat sink including a heat dissipating fin comprising the following.

More specifically, as the base member in the heat sink, a shielding plate for electromagnetic shield (of 150 mm in length, 70 mm in width, 0.5 mm in thickness) which is made of aluminum A1050 was used.

As the heat dissipating fin, a folded (corrugated) fin made of aluminum A1050 in which the height of the mountain-shaped portions is 35 mm, the pitch of mountains is 4 mm, the depth is 20 mm, the number of mountains is 8, and the thickness of the fin plate is 0.4 mm was used.

As the fitting member, a heat receiving and heat transfer block made by an aluminum die casting process (of 90 mm in length, 45 mm in width and 4 mm in thickness) was used, and 15 hole each being 2.2 mm in diameter into which the projecting portion describe later are to be inserted were formed. In the base member, 8 slits of 2.6 mm×20.2 mm in size for the heat dissipating fin were formed, and in addition, 15 pins each being 2 mm in outer diameter and 1.2 mm in height for the projecting portion were formed.

Furthermore, a curved portion of 15 mm in curvature radius was formed in the middle portion of the region positioned between slits of the base member in such manner that the respective curved portions formed in the regions positioned between the slits press elastically the base portions of the heat dissipating fin when the mountain-shaped portions of the heat dissipating fin are inserted into the slits and the heal, dissipating fin is placed between the base member and the fitting member.

The heat sink was prepared by inserting the mountain-shaped portions into the slits from the lower side of the base member, pressing sandwich the heat dissipating fin between the base member and the fitting member by means of a press, and caulking the heads of the pins which are the projecting portions.

Furthermore, a heat transfer rubber sheet (of 25 mm in length, 25 mm in width, 1 mm in thickness, and 2.5 W/mk in heat transfer rate) was adhered onto the heat generating element.

The circuit board and the heat sink were screwed on each other, and said fitting member of the heat sink was attached at a position where the heat transfer rubber sheet became 0.8 mm in thickness.

In an apparatus including the heat sink thus formed, a ventilating fan is installed and a wind of 1.5 m/s in wind velocity flows through the heat dissipating fin.

The apparatus was operated for four hours, and the surface temperature of the heat generating element was measured. As a result, a temperature rise from the atmospheric temperature was 65° C. and the heat resistance including the heat transfer rubber sheet was 4.3° C./W, thus showing excellent performance.

According to the present invention, in case of providing slits in the base member which is in accordance with the shape (the width, depth, mountain pitch and number of the mountains) of mountain-shaped portions of the heat dissipating fin, the external shape of the base member is generally formed by means of a press. According to the present invention, therefore, since the external shape of the base member and the slits can be formed at the same time, it is possible to prepare the base member inexpensively and accurately on a mass-production basis. Furthermore, the mountain-shaped portions of the heat dissipating fin can be easily inserted into the slits by leaving some margin in dimensions of the slits, while applying an insertion guiding jig.

In addition, according to the present invention, since the heat dissipating fin is pressed sandwich and fixed between the fitting member and the base member, the three components of the heat dissipating fin, the fitting member and the base member are well thermally connected to one another and the heat transfer resistance is reduced. It is possible to more effectively perform heat dissipation and cooling when a heat pipe is attached thereto.

Moreover, according to the present invention, since the heads of pins as the projecting portions are caulked in a state where the heat dissipating fin is pressed between the fitting member and the base member, the three components are kept in a state of being well thermally connected to one another even if the pressing, force is released.

Still further, since pressing and caulking are performed by a press, it is possible to inexpensively and accurately perform a mass production.

According to a heat sink of the present invention, therefore, it is possible to inexpensively fix a heat dissipating fin with a low heat transfer resistance on a mass production basis.

According to the present invention, there can be provided a heat sink including a heat dissipating fin, being inexpensive in processing cost, uniform in heat transfer resistance and excellent in heat efficiency without degrading the strength of the fin, and a method for fixing the heat dissipating fin to the heat sink main body.

What is claimed is:

1. A heat sink including a heat dissipating fin thermally connected to a heat generating element through a heat conductive rubber sheet, comprising:

(1) a heat dissipating fin having a plurality of mountain-shaped portions and base portions supporting said mountain-shaped portions; and (2) a base member having a plurality of slits, wherein said mountain-shaped portions of said heat dissipating fin are inserted into said slits of said base member, said base portions of said heat dissipating fin are put between said base member and a heat generating element through a heat conductive rubber sheet.

2. A heat sink including a heat dissipating fin as claimed in claim 1, wherein:

at least a part of regions positioned between said plurality of slits of said base member, said regions being to come into contact with said base portions of said heat dissipating fin, forms a curved portion by being drawn down toward said heat generating element in such manner that said heat dissipating fin is fixed between said base member and said heat generating element through said heat conductive rubber sheet by means of an elastic action of said curved portion.

3. A heat sink including a heat dissipating fin as claimed in claim 2, which further includes at least one bolt and nut, said bolt is inserted into a hole portion provided on respective end portions of said base portions of said heat dissipating fin, and corresponding hole provided on said base member.

4. A heat sink including a heat dissipating fin as claimed in any one of claims 1 and 2, further comprising:

a heat pipe connected to said base portions of said heat dissipating fin.

5. A heat sink including a heat dissipating fin as claimed in claim 3, wherein further comprising:

a heat pipe connected to said base portions of said heat dissipating fin.

* * * * *